United States Patent [19]
Gordon

[11] 3,956,685
[45] May 11, 1976

[54] FREQUENCY RESPONSIVE CIRCUIT

[75] Inventor: James Sneddon Gordon, Bedford, England

[73] Assignee: Texas Instruments Incorporated, Dallas, Tex.

[22] Filed: Nov. 27, 1974

[21] Appl. No.: 527,553

[30] Foreign Application Priority Data
Dec. 3, 1973  United Kingdom............... 56011/73

[52] U.S. Cl..................................... 321/60; 321/1; 328/138; 328/133
[51] Int. Cl.² ........................................ H02M 5/22
[58] Field of Search ................. 320/1; 328/78, 138, 328/133; 321/60

[56] References Cited
UNITED STATES PATENTS

| | | | |
|---|---|---|---|
| 3,014,169 | 12/1961 | MacIntyre | 320/1 |
| 3,166,704 | 1/1965 | Jansons | 320/1 |
| 3,614,581 | 10/1971 | Frost | 320/1 X |
| 3,683,270 | 8/1972 | Mattis | 320/1 X |
| 3,727,081 | 4/1973 | Davis et al. | 320/1 X |
| 3,737,754 | 6/1973 | Katz | 320/1 |

*Primary Examiner*—William M. Shoop
*Attorney, Agent, or Firm*—Hal Levine; James T. Comfort; Richard L. Donaldson

[57] ABSTRACT

A capacitor of limited storage capacity is charged and discharged under control of a switching arrangement. The switching arrangement functions to connect the capacitor to a first steady current source of one polarity for a fixed first interval in each cycle of an input signal, and connects a second steady current source of opposite polarity to the capacitor for the remainder of the input signal cycle so that the voltage stored by the capacitor changes polarity when the frequency of the input signal traverses a threshold value. By shunting the capacitor with a fixed resistor, an output voltage linearly dependent on the input frequency can be obtained. By connecting the switching arrangement to connect the first current source to the capacitor for a fixed interval of time in each cycle of a first input signal, and to connect the second current source to the capacitor for a fixed interval of time in each cycle of a second input signal, a difference frequency discriminator function can be provided. Transistorized current sources and switching circuits, operated under control of a monostable multivibrator are described. The circuit may be used to control a change in the gas-air mixture strength fed to the combustion chamber of an internal combustion engine above a predetermined threshold engine speed.

8 Claims, 4 Drawing Figures $$\frac{I_1}{I_2} = \frac{R_4}{R_2}$$

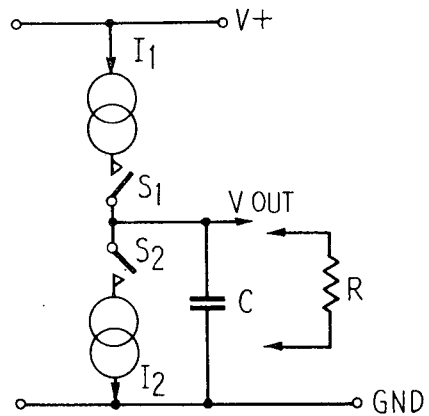
FIG. 1
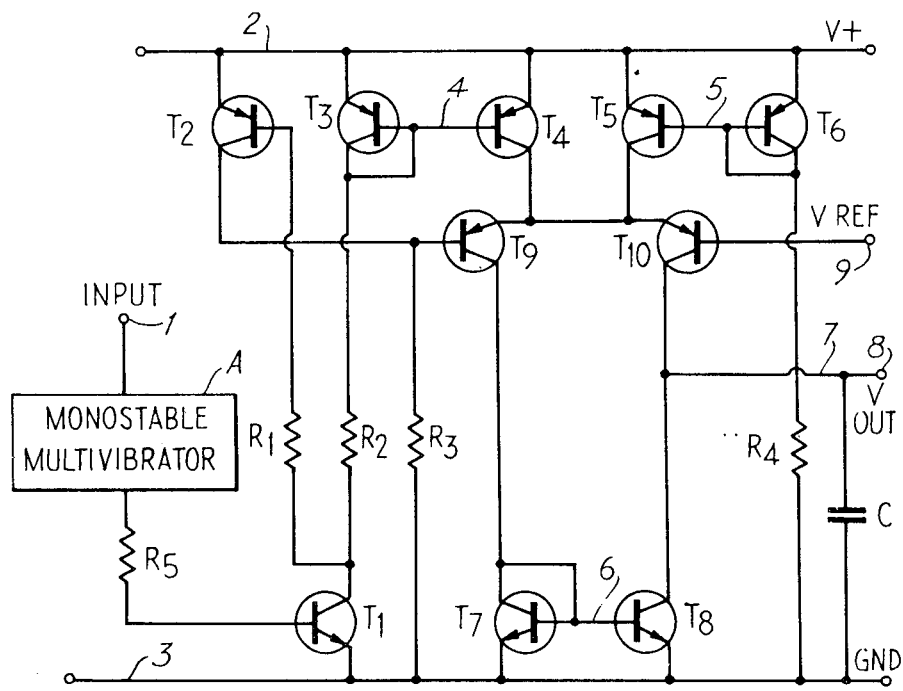
FIG. 2  $\dfrac{I_1}{I_2} = \dfrac{R_4}{R_2}$

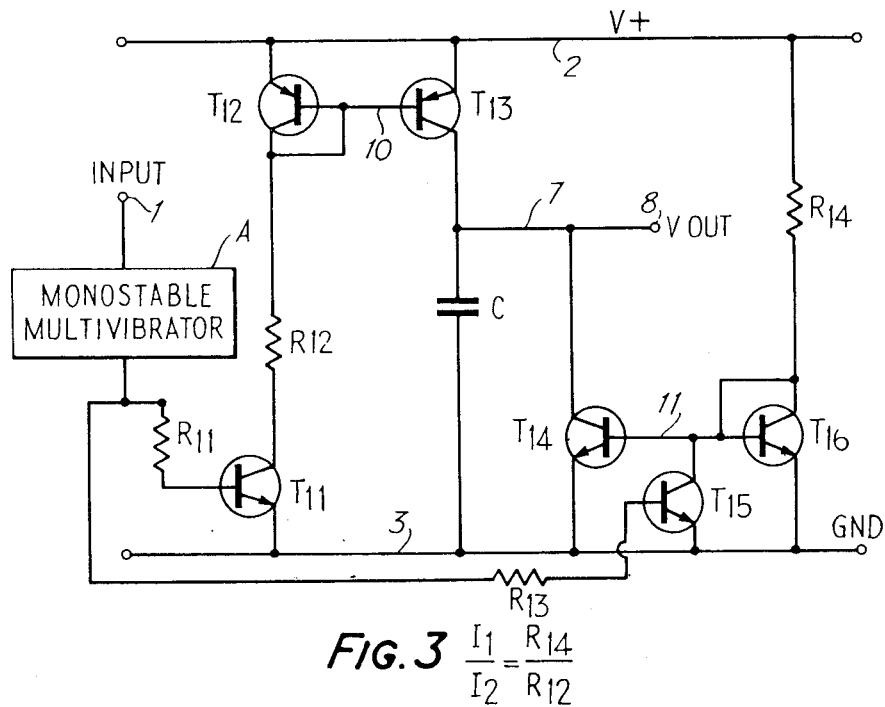
$$FIG. 3 \quad \frac{I_1}{I_2} = \frac{R_{14}}{R_{12}}$$
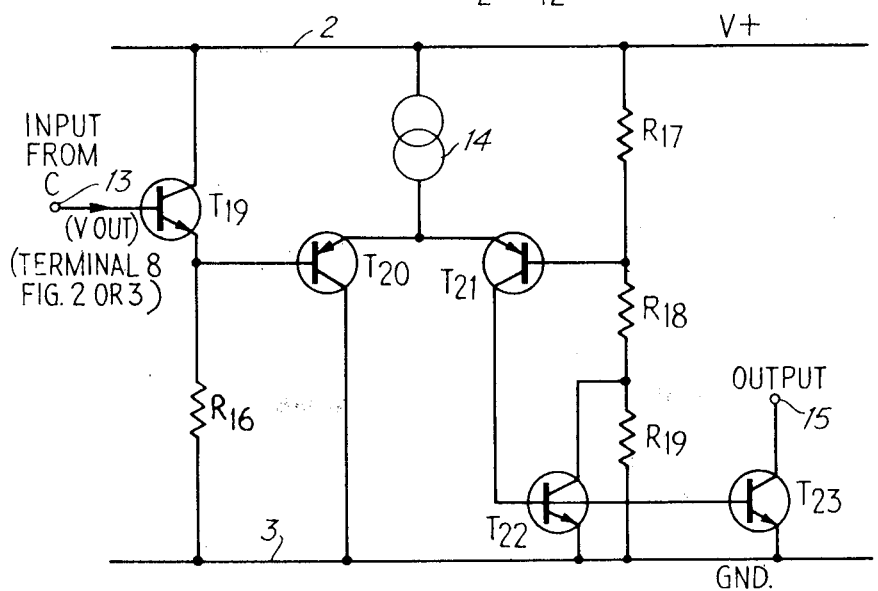
FIG. 4

FREQUENCY RESPONSIVE CIRCUIT

This invention relates to a circuit arrangement responsive to the frequency of an input signal and is particularly but not exclusively applicable to the generation of a signal when the input signal frequency reaches a threshold value.

In a motor vehicle it has been proposed to control the proportions of petrol and air in the mixture fed into the engine by means of electronic circuits controlling means for injecting the fuel into the air stream or even directly into the cylinders of the engine. In order to keep the mixture strength at an optimum value so as to make the most efficient use of the fuel and in addition to reduce the proportion of toxic components in the exhaust gases of the engine, the control of the amount of fuel injected into the air stream must be accurately dependent on several parameters which affect the combustion process. One of these parameters is the rotation of the speed of the engine itself since this affects both the rate of increase of pressure within the combustion chamber and also the period of time available for the combustion of the mixture. It has been found, for some engines at least, it is important to make a change in the mixture strength at about 4,250 r.p.m., which corresponds to an ignition pulse frequency of 140 Hz with a four-cylinder engine. In order to provide the required accuracy of control this engine speed must be detected to an accuracy of between 1 and 2% and filters necessary to detect this condition to the required accuracy are extremely difficult to construct.

It is an object of the present invention to provide a circuit arrangement capable of detecting accurately a relatively low frequency.

According to the present invention there is provided a circuit arrangement responsive to the frequency of an input signal including a capacitor, a first source for generating a first steady current of one polarity, a second source for generating a second steady current of the opposite polarity, the voltage stored by the capacitor being limited, and switching means for enabling the first source to feed the first current to the capacitor for a fixed first interval of time in each cycle of the input signal and for enabling the second source to feed the second current to the capacitor for a second interval of time in each cycle dependent on the frequency of the input signal, whereby the voltage stored by the capacitor changes polarity when the frequency of the input signal traverses a threshold value.

In one example of the invention the interval of time dependent on the frequency of the input signal is the remainder of the time in each cycle after the fixed first interval has been extracted.

The arrangement can be used as a frequency discriminator in which the output is inhibited for frequencies below the threshold value, by providing a fixed resistor or other similar discharge path across the capacitor. The arrangement can also be used as a difference frequency discriminator to provide an indication of the relationship between two input signals by arranging that the switching means enables the first source to feed the first current of the capacitor for a fixed interval of time in each cycle of the first input signal and enables the second source to feed the second current to the capacitor for a fixed interval of time in each cycle of the second input signal. The output of the arrangement will include a certain amount of ripple due to charging and discharging the capacitor and to obtain a steady output it is desirable to include a circuit having hysteresis or backlash for absorbing the ripple. Alternatively a low pass filter can be used to absorb the ripple if the resulting restriction on output frequency can be tolerated.

In order that the invention may be fully understood and readily carried out into effect it will now be described with reference to the accompanying drawings of which:

FIG. 1 is a diagram illustrating the basic principles of one example of a circuit arrangement according to the invention;

FIG. 2 shows one practical embodiment;

FIG. 3 shows a second embodiment; and

FIG. 4 shows one example of a circuit having hysteresis or backlash.

Referring to FIG. 1, a capacitor C is connected from a grounded conductor to two switches S1 and S2. The switch S1 is connected to a current source for feeding a positive current I1 to the capacitor and the switch S2 is connected to a current source for feeding a negative current I2 to the capacitor. The switches S1 and S2 are controlled by means not shown in the drawing so that S1 is closed for a fixed interval in each cycle of an input signal and S2 is closed for an interval of time in each cycle dependent on the frequency of an input signal, which may be the same signal as the first-mentioned input signal.

In one example the switch S2 is closed for the period in each cycle of the input signal in which the switch S1 is not closed. Under these cicumstances the charge fed to the capacitor C during each cycle of the input signal from the first source is $I1 \cdot t$, where $t$ is the fixed interval. The electrical charge taken out of the capacitor C during each cycle by the second source is $$I2 \left( \frac{1}{f} - t \right).$$

The threshold frequency of the circuit is $$\frac{I2}{t(I1 + I2)}$$

and as the threshold frequency f is exceeded, the charge $I1 \cdot t$ becomes greater than the discharge $$I2 \left( \frac{1}{f} - t \right)$$

so that there is a positive residual charge on the capacitor at the end of each cycle of the input signal and this rapidly accumulates to provide a positive voltage across the capacitor C. It is, of course, necessary that the voltage across the capacitor C should be limited in its excursion otherwise a sufficiently large negative voltage could be accumulated whilst the frequency is below the threshold value for a substantial period of time to elapse before the voltage across the capacitor becomes positive.

Because the threshold value of frequency depends on the ratio of two currents, an accurate circuit can be constructed using integrated circuit techniques and the circuit will have reasonable immunity from supply voltage variatons, which is an important consideration in motor vehicle applications. There will be a certain amount of variation in the voltage on the capacitor C as a result of the switching of the currents to it which will produce a ripple on the capacitor. This ripple voltage can be absorbed by the use of a suitable buffer circuit having hysteresis; an example of which is shown in FIG. 4. If desired the polarities of the currents I1 and I2 can be reversed so that the voltage across the capacitor C becomes negative when the input signal exceeds the threshold value. The capacitor C can be returned to any reference voltage which for convenience only is shown as ground.

If the circuit arrangement is to be used as a discriminator to produce an output voltage linearly dependent on the input frequency, then the capacitor C sould be shunted by a fixed resistor R or some equivalent circuit.

FIG. 2 shows one practical embodiment of the circuit arrangement shown diagrammatically in FIG. 1 which is suitable for construction in integrated circuit form. In FIG. 2 the circuit shown has an input terminal 1 and positive and earthed supply conductors 2 and 3. The terminal 1 is connected to the input of a monostable multivibrator A, the output pulses of which are applied through a resistor R5 to the base of a transistor T1, the emitter of which is connected to the conductor 3, and the collector of which is connected through resistor R1 to the base electrode of a transistor T2 and through a resistor R2 to the base and collector electrodes of a transistor T3. The emitter electrodes of transistors 2 and 3 are connected to the conductor 2, as is the emitter electrode of a transistor T4, the base electrode of which is connected to the base electrode of the transistor T3 by a conductor 4. The collector of the transistor T4 is connected amongst other places through the emitter-collector path of a transistor T9 to the base and collector of a transistor T7, the emitter of which is connected to the conductor 3. The base electrode of the transistor T9 is connected to the collector of the transistor T2 and through a resistor R3 to the conductor 3. A transistor T8 having its emitter connected to the conductor 3 has its base electrode connected by a conductor 6 to the base electrode of the transistor T7, and its collector electrode to the collector electrode of a transistor T10 and through a conductor 7 to one electrode of the capacitor C and to an output terminal 8. The other electrode of the capacitor C is connected to the conductor 3. The base electrode of the transistor 10 is connected to a terminal 9 for a reference voltage and its emitter electrode is connected to the emitter electrode of the transistor T9, the collector electrode of transistor T4 and also to the collector electrode of a transistor T5. The emitter electrode of the transistor T5 is connected to the conductor 2 and its base electrode is connected through a conductor 5 to the base and collector electrodes of a transistor T6, the emitter-collector path of which is connected in series with a resistor R4 from the conductor 2 to the conductor 3.

The circuit arrangement of FIG. 2 differs from that indicated in FIG. 1 in that two currents are used to charge the capacitor C during one part of the switching cycle and one of these currents is used to discharge it during the other part of the switching cycle. In the operation of FIG. 2 a succession of pulses or other signals is applied between the input terminal 1 and ground which triggers the multivibrator A to produce a corresponding succession of equal length pulses to turn on the transistor T1 for a fixed interval of time in each cycle of the signal applied to the input terminal and to turn it off for the remainder of the time in each cycle. When the transistor T1 is conducting, the transistor T2 is also conducting and in addition current is drawn by the transistor T3 through resistor R2. Because of the connection together of the bases of transistors T3 and T4, the current passed through the emitter-collector path of the transistor T4 is the same as that through the emitter-collector path of the transistor T3, which is in turn determined by the resistor R2. A similar circuit configuration is provided by the transistors T5 and T6 so that the current from the collector of the transistor T5 is determined by the resistor R4. Because the transistor T2 is conducting, the transistor T9 is non-conducting so that transistors T7 and T8 are non-conducting also. Therefore the currents through the emitter-collector paths of the transistors T4 and T5 are both routed through the transistor T10 to charge the capacitor C. The transistor T10 is conducting at this time because of its connection as a long-tailed pair with transistor T9 and it has a fixed voltage VREF applied to its base which is suitably chosen. Thus when the signal applied to the base of transistor T1 is positive the regulated currents determined by the resistors R2 and R4 are fed through the transistors T4 and T5 to the capacitor C to charge it positively.

When the voltage of the signal applied to its base becomes zero or negative, however, the transistor T1 ceases conducting so that the transistor T9 is rendered conducting by virtue of the connection of its base through resistor R3 to the conductor 3. No current is drawn through the resistor R2 because the transistor T1 is non-conducting, with the result that the transistors T3 and T4 are non-conducting. The current through the resistor R4 continues to flow, however, so as to cause a regulated current to flow through the emitter-collector path of the transistor T5. The regulated current through the transistor T5 flows through the emitter-collector path of the transistor T9, which being conducting causes the transistor T10 to be non-conducting, and the regulated current flows through transistor T7 and causes T8 to discharge the capacitor C with a current determined by the resistor R4.

It will be appreciated that the circuit arrangement of FIG. 2 differs from FIG. 1 in that the charging of the capacitor is performed by the sum of two currents I1 and I2 respectively determined by R2 and R4 and its discharging by a current I2 determined by R4 alone.

FIG. 3 shows another embodiment of the invention which is similar to FIG. 1 in that the charging of the capacitor is carried out by a single regulated current and the discharge by another regulated current. In FIG. 3 the components which correspond to those of FIG. 2 have the same reference numbers.

The input signal is applied via the terminal 1 to the monostable multivibrator A which is connected through a resistor R11 to the base of a transistor T11, the emitter of which is connected to the grounded conductor 3 and the collector of which is connected to the base and collector of a transistor T12. The emitter of the transistor T12 is connected to the positive supply conductor 2, and its base is connected to the base of a transistor T13, the emitter-collector path of which is connected from the conductor 2 to one electrode of the capacitor C and also to the conductor 7 and the output terminal 8. The other electrode of the capacitor C is connected to the conductor 3. The output of multivibrator A is also connected through a resistor R13 to the base of a transistor T15, the emitter-collector path is connected between the conductor 3 and a conductor 11 connecting together the base electrodes of two transistors T14 and T16. The emitter-collector path of the transistor T14 is connected from the conductor 3 to the conductor 7 and the emitter-collector path of the transistor T16 is connected in series with a resistor R14 from the conductor 3 to the conductor 2. The base of the transistor T16 is connected to its collector.

In the operation of FIG. 3 when the signal from the output of the multivibrator A is positive the transistors T11 and T15 are conducting with the result that a charging current determined by the resistor R12 is fed to the capacitor C through the emitter-collector path of the transistor T13 by virtue of the connection of its base by means of the conductor 10 to the base of the transistor T12, the emitter-collector path of which is connected in series with the resistor R12. The transistor T15 being conducting renders the transistor T14 non-conducting by the connection of its base to the conductor 3. When the signal from the multivibrator A becomes zero or negative the transistors T11 and T15 cease conducting so that the transistor T13 no longer conducts and the charging current to the capacitor C is cut off. At this time the transistor T14 is conducting a current determined by the resistor R14 by virtue of the connection of the base of the transistor T14 through the conductor 11 to the base of the transistor T16, the emitter-collector path of which is connected in series with the resistor R14. Thus the charging and discharging of the capacitor C by controlled current can be effected by the circuit of FIG. 3 under the control of a suitable input signal.

One application of the circuit arrangements described above is to produce an output signal when a frequency of an input signal exceeds a threshold value, the input signal being applied to trigger the monostable multivibrator which produces a positive going pulse for a fixed interval of time less than the cycle time of the input signal in each cycle of the input signal. These pulses from the multivibrator would be applied to the input terminal 1 of the circuit arrangement of FIG. 2 or FIG. 3 to cause the capacitor C to be charged for the fixed interval in each cycle of the input signal and to be discharged for the remainder of each cycle. As explained above with reference to FIG. 1 the output voltage appearing at the terminal 8 would suddenly become positive when the frequency of the input signal reaches the threshold value. If the rise and fall of the voltage across the capacitor C due to its successive charge and discharge by the controlled current cannot be tolerated by a sensor circuit used for detecting the rise in output voltage when the input frequency exceeds the threshold value, then a circuit having hysteresis could be interposed so as to absorb the ripple voltage. Many such hysteresis circuits have been proposed and they may employ suitably biased diodes connected to the input circuits of d.c. amplifiers. One example of such a circuit is described below with reference to FIG. 4.

The hysteresis circuit shown in FIG. 4 includes a transistor T19 connected as an emitter follower with an emitter load resistor R16, the input to the circuit being applied via a terminal 13 to the base electrode of the transistor T19. As in the other circuits described herein the positive supply conductor carries the reference 2 and the earthed supply conductor the reference 3. The emitter of the transistor T19 is connected to the base of a transistor T20 which is connected in a long-tailed pair circuit with a transistor T21 with which it shares a current source 14 as emitter load. The collector of the transistor T20 is connected to the conductor 3 and the collector of the transistor T21 is connected to the base electrodes of transistors T22 and T23. Between the conductors 2 and 3 is connected a series chain of three resistors R17, R18 and R19. The base of the transistor T21 is connected to the conjunction of resistors R17 and R18 and the collector of the transistor T22 is connected to the conjunction of R18 and R19. The emitter electrodes of transistors T22 and T23 are connected to earth and the collector electrode of the transistor T23 is connected to an output terminal 15. Transistors T19, T22 and T23 are of n-p-n conductivity type and transistors T20 and T21 are of p-n-p conductivity type.

In the operation of the circuit of FIG. 4 the input signal passes through the transistor T19 and is applied to the base of the transistor T20 from which it is applied to the emitter of the transistor T21 and from the collector of that transistor to the output transistor T23 so that the signal appears at the output terminal 15. For positive going values of the input signal the collector of the transistor T21 also is positive going so that the transistor T22 is rendered conducting so that it short-circuits the resistor R19. Because the resistor R19 is short-circuited the potential fed to the base electrode of the transistor T21 is more negative than it would be if the transistor T22 were not conducting. The result of this is that when the transistor T21 is rendered more conducting by the application of a positive going signal to its emitter electrode it tends to become more conducting because of the more negative voltage applied to its base electrode due to the shortening of the resistor R19 by the transistor T22. If now the input voltage becomes more negative, it must pass below the level at which the transistor T21 first became conducting before it can render it non-conducting because of the more negative voltage being applied to the base electrode of that transistor. However, when the conductivity of the transistor T21 falls sufficiently to terminate the conductivity of the transistor T22, the resistor R19 again becomes effective in the series resistor chain so making the potential applied to the base of the transistor T21 more positive again. It will be apparent therefore that by virtue of the positive feedback connection of the transistors T21 and T22 relative to each other the circuit shown in FIG. 4 will exhibit backlash or hysteresis in that its output will tend to remain unchanged in one direction unless the change in the input signal level exceeds the backlash built into the circuit. The magnitude of the backlash voltage will depend on the relative values of the resistors R17, R18 and R19, and adjustment of these values will allow the circuit to be matched to the ripple emanating from the capacitor C due to its charge and discharge.

The current source 14 may consist of a simple series resistor or it may be a more complex circuit, for example, having the emitter-collector path of a first transistor connected between the conductor 2 and the emitter electrodes of the transistors T20 and T21, with the base electrode of that first transistor being connected to the base and collector electrodes of a second transistor the emitter-collector path of which is connected in series with a fixed resistor between the conductors 2 and 3.

The circuit arrangements of FIGS. 2 and 3 could be used as frequency discriminators having a response which is suppressed for frequency below the threshold value by connecting a fixed resistor or equivalent circuit across the capacitor C. A low pass filter or hysteresis circuit should be connected to the output of the circuit when it is used as a discriminator to absorb the ripple due to the charging and discharging of the capacitor.

In addition to the use of the present invention to provide a control of the mixture fed to a petrol engine it may also be used to alter the value of oil pressure at which an alarm indication is given in dependence upon the engine's speed.

I claim:

1. A circuit arrangement responsive to the frequency of an input signal, including capacitor means for storing a voltage not exceeding a predetermined value; first and second current source means for generating first and second steady currents respectively; transistor switching means operably responsive to a variable frequency input signal operably to connect said first current source means to said capacitor means for a fixed first time interval in each cycle of said input signal to change the voltage stored by said capacitor means in a first sense, and for enabling said second current source means operably to connect said second current to said capacitor means for a second time interval in each said cycle dependent on the frequency of said input signal to change the voltage stored by said capacitor means in an opposite sense, such that said capacitor means stores a residual voltage of said one sense when the frequency of said input signal traverses a threshold value, said residual voltage having a value dependent on said input signal frequency; and wherein each of said current source means includes first and second like conductivity type transistors, said first transistor having an emitter connected to a first supply conductor and a collector connected by a path including a resistor to a second supply conductor, said second transistor having an emitter connected to said first supply conductor and a base connected to the base of said first transistor such that a current determined by said resistor tends to flow through the collector of said second transistor.

2. An arrangement according to claim 1 wherein the switching means enables the second current source means to feed the second current to the capacitor for the time remaining in each cycle outside the fixed first interval of time.

3. An arrangement according to claim 2 wherein the input signal comprises a rectangular waveform including pulses of a duration equal to said fixed time interval at a repetition frequency defining the frequency of the input signal, and said switching means is operably responsive to the input signal to enable the first current source means to feed the first current to the capacitor means for the duration of said pulses and to enable the second current source means to feed the second current to the capacitor means throughout the periods between said pulses.

4. An arrangement according to claim 3 wherein the input signal is derived from a monostable multivibrator.

5. An arrangement according to claim 1, wherein the first current consists of the sum of a current equal in magnitude to the second current and a third current, the switching means including means for disabling the generation of the third current for the second time interval in each cycle dependent on the frequency of an input signal, and controllable means to provide a conductive path for the current generated by the second current source means to effect said change in voltage stored by said capacitor means in said second sense.

6. An arrangement according to claim 1 wherein the switching means enables the second current source means to feed the second current to the capacitor means for a fixed interval in each cycle of a second input signal different from the first-mentioned input signal, for producing a voltage stored on said capacitor means that is dependent on the relationship between the frequencies of the first-mentioned input signal and the second input signal.

7. An arrangement according to claim 1, including resistor means connected in parallel with said capacitor means for producing a linear relation between said residual voltage stored on said capacitor means and the frequency of said input signal.

8. A circuit arrangement responsive to the frequency of an input signal, including:

capacitor means for storing a voltage not exceeding a predetermined value;

balanced amplifier means comprising first and second transistors having a common emitter circuit including first and second parallel connected current source means, an emitter supply line and a collector supply line for said first and second transistors, means for applying a predetermined reference voltage to the base of said second transistor;

said first and second current source means each including third and fourth transistors of like conductivity type, said third transistor having a base connected to the base and collector of said fourth transistor, said third and fourth transistors having emitters connected to said emitter supply line, said third and fourth transistors having collectors connected to the emitters of said first and second transistors, and the collector of said fourth transistor connected by means including a resistor to said collector supply line;

third constant current source means including fifth and sixth transistors of like conductivity type, said fifth and sixth transistors having emitters connected to said collector supply line and collectors connected respectively to the collectors of said first and second transistors, said sixth transistor having a base connected to the base and collector of said fifth transistor;

means connecting said capacitor means between the collector of said second transistor and said collector supply line;

transistor switching means operably responsive to a variable frequency input signal to apply a switch input to the base of said first transistor to switch said first transistor and said second transistor respectively to non-conductive and conductive conditions for a fixed first time interval in each cycle of said input signal such that said first and second current source means supply current through said second transistor to change the voltage stored by said capacitor means in a first sense, and to switch said first and second transistors respectively to conductive and non-conductive conditions for a second time interval in each said cycle dependent on the frequency of said input signal such that said first current source is disabled and said second and third current sources are enabled for changing the voltage stored by said capacitor in an opposite sense such that there is a residual voltage stored by said capacitor means when the frequency of said input signal traverses a threshold value, said residual voltage having a value dependent on said input signal frequency.

\* \* \* \* \*